US006980572B2

(12) United States Patent
Geske

(10) Patent No.: US 6,980,572 B2
(45) Date of Patent: Dec. 27, 2005

(54) WAVELENGTH SELECTABLE LIGHT SOURCE

(75) Inventor: Jonathan Charles Geske, Ventura, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/446,980

(22) Filed: May 28, 2003

(65) Prior Publication Data

US 2003/0231664 A1 Dec. 18, 2003

Related U.S. Application Data

(60) Provisional application No. 60/383,510, filed on May 28, 2002.

(51) Int. Cl.$^7$ ............................................. H01S 3/121
(52) U.S. Cl. ......................................... 372/15; 372/14
(58) Field of Search .................................... 372/14–15

(56) References Cited

U.S. PATENT DOCUMENTS

| | | | | |
|---|---|---|---|---|
| 3,901,578 A | * | 8/1975 | Hudson ........................ | 359/15 |
| 5,754,217 A | * | 5/1998 | Allen .......................... | 347/239 |
| 6,081,539 A | | 6/2000 | Mattori et al. | |
| 6,121,983 A | * | 9/2000 | Fork et al. .................... | 347/134 |
| 6,282,213 B1 | | 8/2001 | Gutin et al. | |
| 6,327,287 B1 | * | 12/2001 | Kner et al. .................... | 372/43 |
| 6,393,038 B1 | * | 5/2002 | Raymond et al. .............. | 372/22 |
| 6,430,332 B1 | * | 8/2002 | Laor et al. .................... | 385/18 |
| 6,504,967 B1 | * | 1/2003 | Zhou et al. .................... | 385/18 |
| 6,573,162 B2 | * | 6/2003 | Tanaka et al. ............... | 438/487 |
| 6,693,926 B2 | * | 2/2004 | Cayrefourcq et al. ......... | 372/14 |
| 6,771,855 B2 | * | 8/2004 | Pezeshki et al. .............. | 385/31 |
| 6,781,734 B2 | * | 8/2004 | Vail et al. .................... | 359/239 |
| 2002/0018496 A1 | | 2/2002 | Gutin | |
| 2002/0064192 A1 | | 5/2002 | Missey et al. | |
| 2002/0085594 A1 | * | 7/2002 | Pezeshki et al. .............. | 372/20 |
| 2002/0085806 A1 | * | 7/2002 | Pezeshki et al. .............. | 385/31 |
| 2002/0154376 A1 | * | 10/2002 | Vail et al. .................... | 359/238 |
| 2002/0196816 A1 | | 12/2002 | Shirasaki | |
| 2003/0030919 A1 | * | 2/2003 | Pezeshki ...................... | 359/726 |
| 2003/0039275 A1 | * | 2/2003 | Pezeshki ...................... | 372/20 |

FOREIGN PATENT DOCUMENTS

WO  WO 02/45219 A1  6/2002

OTHER PUBLICATIONS

Chang-Hasnain, Connie J., "Tunable VCSEL", *IEEE Journal On Selected Topics In Quantum Electronics*, vol. 6, No. 6, Nov./Dec. 2000, pp. 978-987.

(Continued)

*Primary Examiner*—Minsun Oh Harvey
*Assistant Examiner*—Phillip Nguyen
(74) *Attorney, Agent, or Firm*—Gates & Cooper LLP

(57) ABSTRACT

A wavelength selectable light source is comprised of a two-dimensional (2-D) array of variable wavelength vertical-cavity surface-emitting lasers (VCSELs), wherein light beams emitted from the VCSELs are coupled into an output optical fiber. The light beams emitted from the VCSELs are collimated via a 2-D array of micro-lenses, the collimated light beams impinge upon a first fixed-position mirror that points each of the collimated light beams toward a second movable mirror located at a common focal point in a common area, and the second movable mirror redirects the collimated light beams into a lens coupled to the output optical fiber. By moving the second movable mirror, different ones of the collimated light beams can be directed into the output optical fiber, so that the second movable mirror performs a wavelength selection function.

44 Claims, 4 Drawing Sheets

OTHER PUBLICATIONS

Coldren, Larry A., "Monolithic Tunable Diode Lasers", *IEEE Journal On Selected Topics In Quantum Electronics*, vol. 6, No. 6, Nov./Dec. 2000, pp. 988-999.

Pezeshki, B., et al., "20-mW Widely Tunable Laser Module Using DFB Array and MEMS Selection", *IEEE Photonics Technology Letters*, vol. 14, No. 10, Oct. 2002, pp. 1457-1459.

\* cited by examiner

WAVELENGTH SELECTABLE LIGHT SOURCE

CROSS-REFERENCE TO RELATED APPLICATION

This application claims priority under 35 U.S.C. §119(e) to co-pending and commonly-assigned Provisional Application Ser. No. 60/383,510, entitled "VERTICAL-CAVITY TUNABLE LASER," filed on May 28, 2002, by Jonathan Charles Geske, which application is incorporated by reference herein.

STATEMENT OF GOVERNMENT SUPPORT

This invention was made with Government support by the Air Force of Scientific Research (AFOSR) Grant F49620-96-1-0349. The government may have certain rights in this invention.

BACKGROUND OF THE INVENTION

1. Field of the Invention

This invention relates to optical devices, and more particularly, to wavelength selectable light sources and tunable lasers.

2. Description of the Related Art

Wavelength selectable light sources and tunable lasers are well known in the art. Wavelength selectable light sources are often used in place of a tunable laser, or in conjunction with laser tuning. Tunable lasers function as wavelength selectable light sources by varying a combination of temperature, current, or other suitable input to the device, such that the wavelength out put from the tunable laser can be selected. For this reason, tunable laser approaches and wavelength selectable laser approaches will be described herein and the phrase "wavelength selectable light source" will be used herein to refer to both.

The following references, which are incorporated by reference herein, provide a good review of the technology.
 (1) L. A. Coldren, "Monolithic Tunable Diode Lasers," IEEE Journal on Selected Topics in Quantum Electronics, Vol. 6, No. 6, pp. 988–999, 2000.
 (2) C. J. Chang-Hasnain, "Tunable VCSEL," IEEE Journal on Selected Topics in Quantum Electronics, Vol. 6, No. 6, pp. 978–987, 2000.
 (3) B. Pezeshki, et al., "20-mW Widely Tunable Laser Module Using DFB Array and MEMS Selection," IEEE Photonics Technology Letters, Vol. 14, No. 10, pp. 1457–1459, 2002.

Generally, wavelength selectable light sources can be classified into four main categories:
 (1) In-plane tunable lasers, including sample grating lasers, and vertical grating coupler filter lasers,
 (2) External cavity lasers having movable gratings and/or mirrors,
 (3) Tunable vertical-cavity surface-emitting lasers (VCSELs) having deformable mirror devices, and
 (4) In-plane laser arrays combined using multiplexers or linearly-cascading the lasers.

The first two categories of devices operate primarily on the principle of varying the wavelength for which strong feedback occurs into the active region. The third category operates on the principle of varying the cavity length of the laser (this principle is present to a lesser extent in the operation of the first two categories of devices as well). The last category utilizes one-dimensional (1-D) in-plane laser arrays. Each element of the array can be a tunable laser or a fixed-wavelength laser. The lasers can be linearly cascaded such that they share the same waveguide, or they can be combined using a multiplexer.

The Pezeshki, et al. reference cited above is an example of a 1-D distributed feedback (DFB) laser array that utilizes a single movable mirror and a lens as the multiplexing technique. This technique works well for small device array dimensions, such as the 120 micrometer array width used in the reference. For large device array dimensions, large optical elements and large tilt angle movable mirrors are required. This poses technical problems that could include difficulties, such as fabricating a large flat movable mirror, slow response time of the large mirror, aberrations in the optics, and astigmatism in the lens. These difficulties affect the usefulness of this technique when larger array dimensions are considered.

In technologies that utilize a single active region structure as the gain medium, the tuning range is fundamentally limited to less than 100 nm, and typically the useful range is less than 40 or 50 nm. Even technologies that can use multiple device active regions for gain at different wavelengths, such as linear cascade and multiplexed in-plane lasers, are limited in their wavelength range due to difficulties in scaling to a high number of devices and in coupling the power from all the devices efficiently into a single fiber. Consequently, there is a need in the art for improved wavelength selectable light sources.

SUMMARY OF THE INVENTION

The present invention is a wavelength selectable light source comprised of a two-dimensional (2-D) array of variable wavelength vertical-cavity surface-emitting lasers (VCSELs). The VCSELs in the 2-D array are coupled, one VCSEL at a time, into an output optical fiber using a system of mirrors. Light beams emitted from the 2-D array of VCSELs are first collimated via a 2-D array of micro-lenses. The collimated beams impinge upon a first fixed-position mirror that is designed to point each of the collimated beams toward a common area. Located at the common area is a second movable mirror. This second movable mirror is capable of redirecting beams, one at a time, into a lens that focuses the beams into the output optical fiber. By moving the second mirror, different beams can be pointed into the output optical fiber. In this way, the second movable mirror performs a wavelength selection function.

In the case where an external laser is used for pumping, a collimated optical pump beam can be delivered to the VCSEL corresponding to the desired wavelength by following a reciprocal path through the device. The optical pump beam can enter the device via the output optical fiber and lens. The optical pump beam is then directed by the second movable mirror toward the desired VCSEL of the 2-D array via the first fixed-position mirror. The optical pump beam is focused by the micro-lens of the selected VCSEL into an active region of the selected VCSEL. The laser radiation emitted by the selected VCSEL is then directed to the output optical fiber in the manner previously described.

In the present invention, a different VCSEL is used for each wavelength or range of wavelengths. Hence, there are no fundamental limits to the wavelength range of the device, except those imposed by the design of the optics, the reflectivity bandwidth of the mirrors, and, in the case of optically pumped VCSELs, the pump beam wavelength chosen. The use of the mirror system ensures that the dual variables of beam position and direction are controlled.

The use of an external optical pump also provides an advantage over some other types of tunable VCSELs, because the pump laser can be separately optimized for high power emission and reliability, and its excess heat can be located remotely from the 2-D array of VCSELs.

The use of the second movable mirror separate from the 2-D array of VCSELs is also an advantage, because it allows for separate optimizations of VCSEL and mirror performance, because the second movable mirror is not part of the optical cavity of the VCSEL. This is not the case with other types of devices having only a single VCSEL that uses movable mirrors.

Consequently, the wavelength selectable light source of the present invention is useful for fiber optic network applications and sensor applications. In fiber optic networks, wavelength selectable light sources are being considered for both device-sparing applications and for wavelength provisioning applications.

DETAILED DESCRIPTION OF THE INVENTION

In the following description, reference is made to the accompanying drawings which form a part hereof, and which is shown, by way of illustration, an embodiment of the present invention. It is understood that other embodiments may be utilized and structural changes may be made without departing from the scope of the present invention.

Figure 1A:
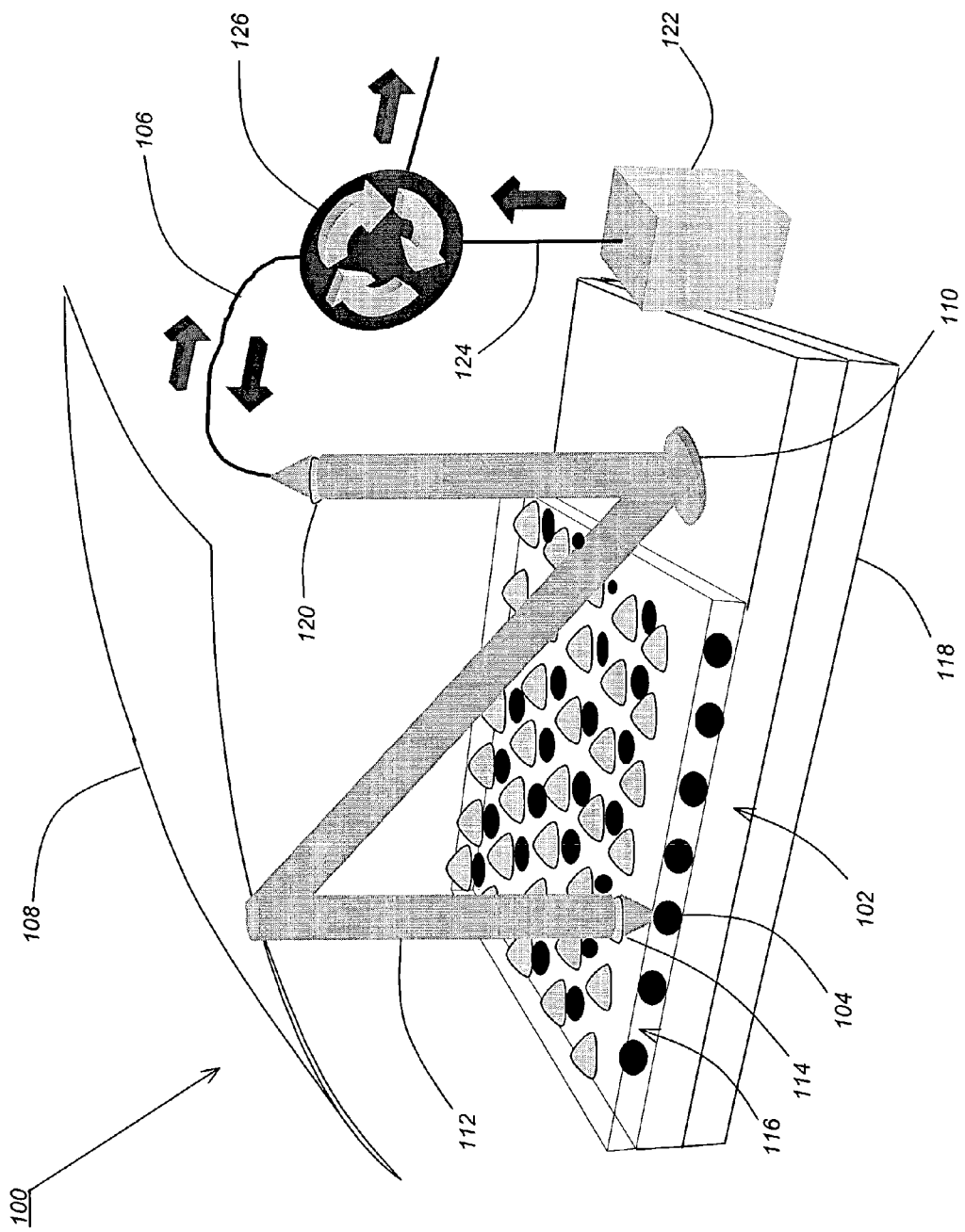
FIGS. 1A and 1B illustrate wavelength selectable light sources according to alternative embodiments of the present invention.
Figure 1B:
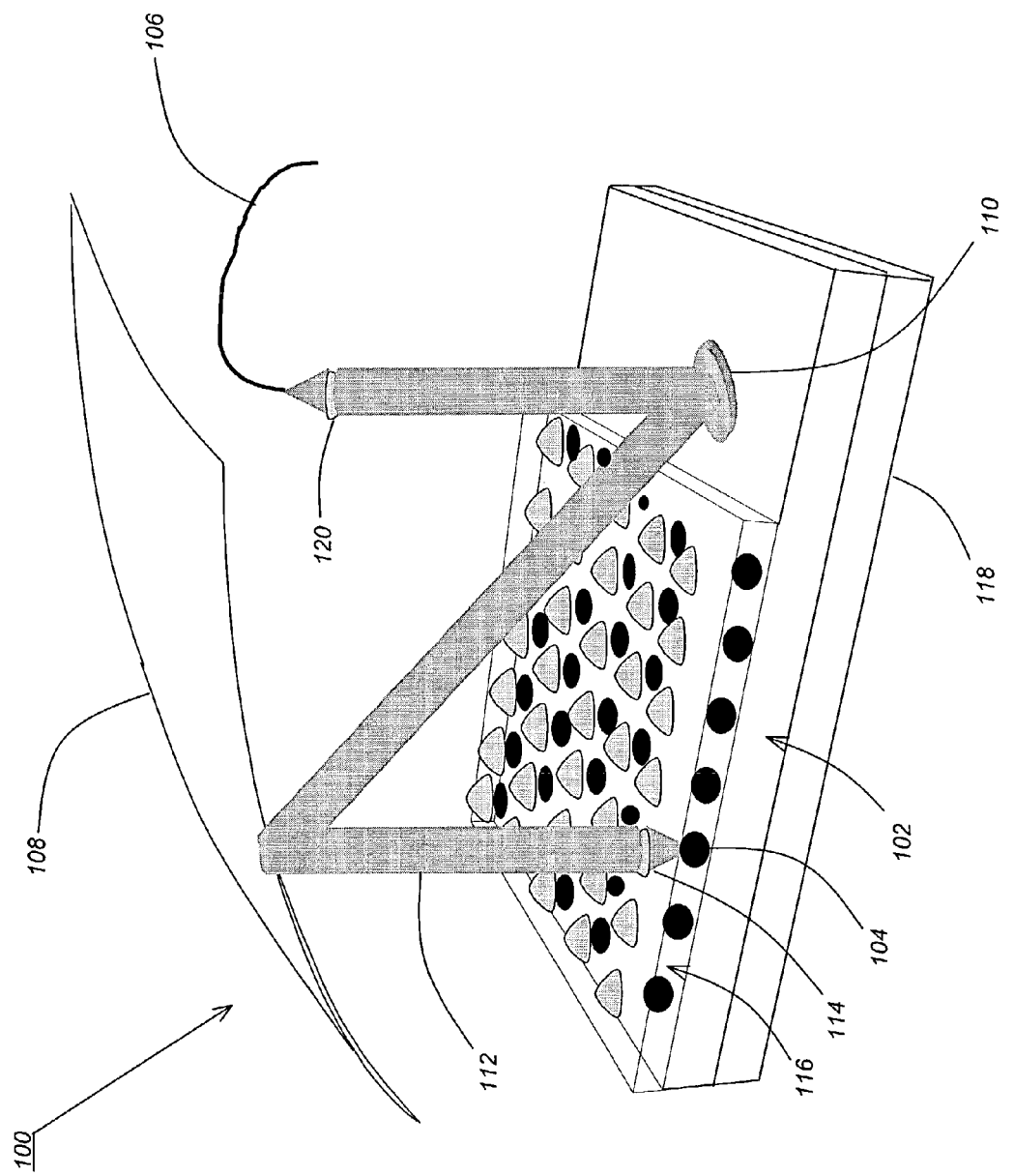

FIGS. 1A and 1B illustrate wavelength selectable light sources according to alternative embodiments of the present invention. FIG. 1A illustrates a first embodiment where the wavelength selectable light source uses optical pumping, and FIG. 1B illustrates a second embodiment where the wavelength selectable light source is implemented without optical pumping.

As shown in FIGS. 1A and 1B, a wavelength selectable light source 100 of the present invention can be realized using a two-dimensional (2-D) array of variable wavelength light emitters, which in this embodiment comprise vertical-cavity surface-emitting lasers (VCSELs) 102 fabricated on a substrate. A VCSEL 104 in the 2-D array 102 is optically coupled (one VCSEL 104 at a time) into an optical output system 106 comprising an optical output fiber, using a system of mirrors comprising a first fixed-position 108 and second movable mirror 110. Specifically, a selected one of a plurality of light beams 112 emitted from the array 102 is delivered to the optical output fiber 106 using the first fixed-position mirror 108 and the second moveable mirror 110 in an optical path of each of the light beams 112, wherein there is no substantial relative motion between the array 102 and the optical output fiber 106.

In one embodiment, each of the light beams 112 emitted from the 2-D array of VCSELs 102 is substantially collimated and shaped by a corresponding micro-lens 114 in a 2-D array of micro-lenses 116 before impinging upon the first fixed-position mirror 108. In another embodiment, the 2-D array of micro-lenses 116 can be used in conjunction with the fixed position mirror 108 to form substantially collimated beams deflected from the fixed-position mirror 108. In all cases, the 2-D array of micro-lenses 116 can be monolithically integrated with the substrate of the 2-D array of VCSELs 102, or fabricated in glass or a similar dielectric. Also shown in FIGS. 1A and 1B is a heat sink 118 that is used to mount the 2-D array of VCSELs 102 for improved thermal performance.

Light beams 112 emitted from the VCSELs 104 impinge upon the first fixed-position mirror 108, wherein the first fixed-position mirror 108 redirects the light beams 112 toward a common area where the second moveable mirror 110 resides. This first fixed-position mirror 108 may be used in multiple ways.

One way is to design the first fixed-position mirror 108 as a 2-D array of substantially flat mirrors designed to correspond one-to-one or one-to-many with the individual VCSELs 104 of the 2-D array of VCSELs 102. For example, the first fixed-position mirror 108 may be a 2-D array of micro-electro-mechanical (MEMs) mirrors with each mirror appropriately pointed to deflect the light beams 112 toward a common area where the second movable mirror 110 is located. By using a 2-D array of MEMs mirrors as the first fixed-position mirror 108, minor adjustments can be made to the angle of the mirrors of the first fixed-position mirror 108 to aid in fabrication and initial alignment of the wavelength selectable light source 100.

In the one-to-one configuration, each element of the mirror array comprising the first fixed-position mirror 108 is substantially centered along a surface-normal central axis of each VCSEL 104 of the 2-D array of VCSELs 102. In the one-to-many configuration, each element of the mirror array comprising the first fixed-position mirror 108 is substantially centered along a surface-normal central axis of a cluster of VCSELs 104 of the 2-D array of VCSELs 102. Such a mirror 108 can deflect the beams 112 to the common area without substantially affecting the shape of the beams 112.

It is also expected that using a first fixed-position mirror 108 having a flat facet corresponding to each VCSEL 104 of the 2-D array of VCSELs 102 centered along a surface-normal central axis of each VCSEL 104 will provide the best coupling of the optical power from the VCSEL 104 to the output optical fiber 106.

Another way to make the mirror 108 is to use a substantially parabolic shaped mirror 108 to direct all of the light beams 112 to the common area located at a focus of the mirror 108. Light beams 112 traveling substantially parallel to the axis of the parabolic mirror 108 will be redirected to the focus of the parabolic mirror 108. This technique is not as ideal, because the coupling efficiency will vary for different VCSELs 104 in the 2-D array of VCSELs 102. However, for some applications, it may be sufficient.

Still another way to make the mirror 108 is to use the mirror 108 shape, in conjunction with the specific shape and properties of the 2-D array of micro-lens 116, to generate substantially collimated light beams 112. These collimated beams 112 are then redirected toward the common area.

As noted above, the second movable mirror 110 is located at the common area. Different ones of the light beams 112 are redirected, one at a time, to the optical output fiber 106, so that the second movable mirror 110 performs wavelength selection. Specifically, by moving the second movable mirror 110, different beams 112 can be selected and deflected into a lens 120 coupled to the output optical fiber 106. In this way, the second movable mirror 110 performs a wavelength selection function.

In one embodiment, the second movable mirror 110 is a MEMs mirror. However, the second movable mirror may be implemented using other techniques as well.

In another embodiment, for some applications where uniform coupling is not important, the input to the output optical fiber 106 can be directly located at the common area, thus eliminating the need for the second movable mirror 110.

In FIG. 1A, the wavelength selectable light source 100 is coupled to an optical pump 122, i.e., an external laser, for generating an optical pump beam 124 that is delivered to one or more of the VCSELs 104 corresponding to a desired wavelength by following a reciprocal optical path through the wavelength selectable light source 100. The optical pump beam 124 is introduced into the output optical fiber 106 with a circulator 126, or other wavelength-combining element. The optical pump beam 124 then enters the wavelength selectable light source 100 via the output optical fiber 106 and is shaped by the lens 120 coupled to the output optical fiber 106. The optical pump beam 124 is subsequently directed by the second movable mirror 110 towards the desired VCSELs 104 via the first fixed-position mirror 108. The optical pump beam 124 is focused by the micro-lens 114 associated with the selected VCSELs 104 into an active region of the selected VCSELs 104. The light beam 112 subsequently emitted by the selected VCSELs 104 is then directed to the output optical fiber 106 in the manner previously described.

In this optically pumped version, a first fixed-position mirror comprising a 2-D array of flat surfaced mirrors is expected to provide optimal coupling of the optical pump beam 124 into each of the VCSELs 104. The use of optical pumping in this device is expected to be the most efficient technique for achieving the wavelength selectable laser source, because it allows for potentially higher output powers and does not require electrical power to be delivered to each of the VCSELs 104 in the 2-D array of VCSELs 102.

Integrating the 2-D array of micro-lens 116 into the backside of the substrate having the 2-D array of VCSELs 102 is expected to simplify the assembly of the device. However, other techniques could be used as well.

Figure 2:
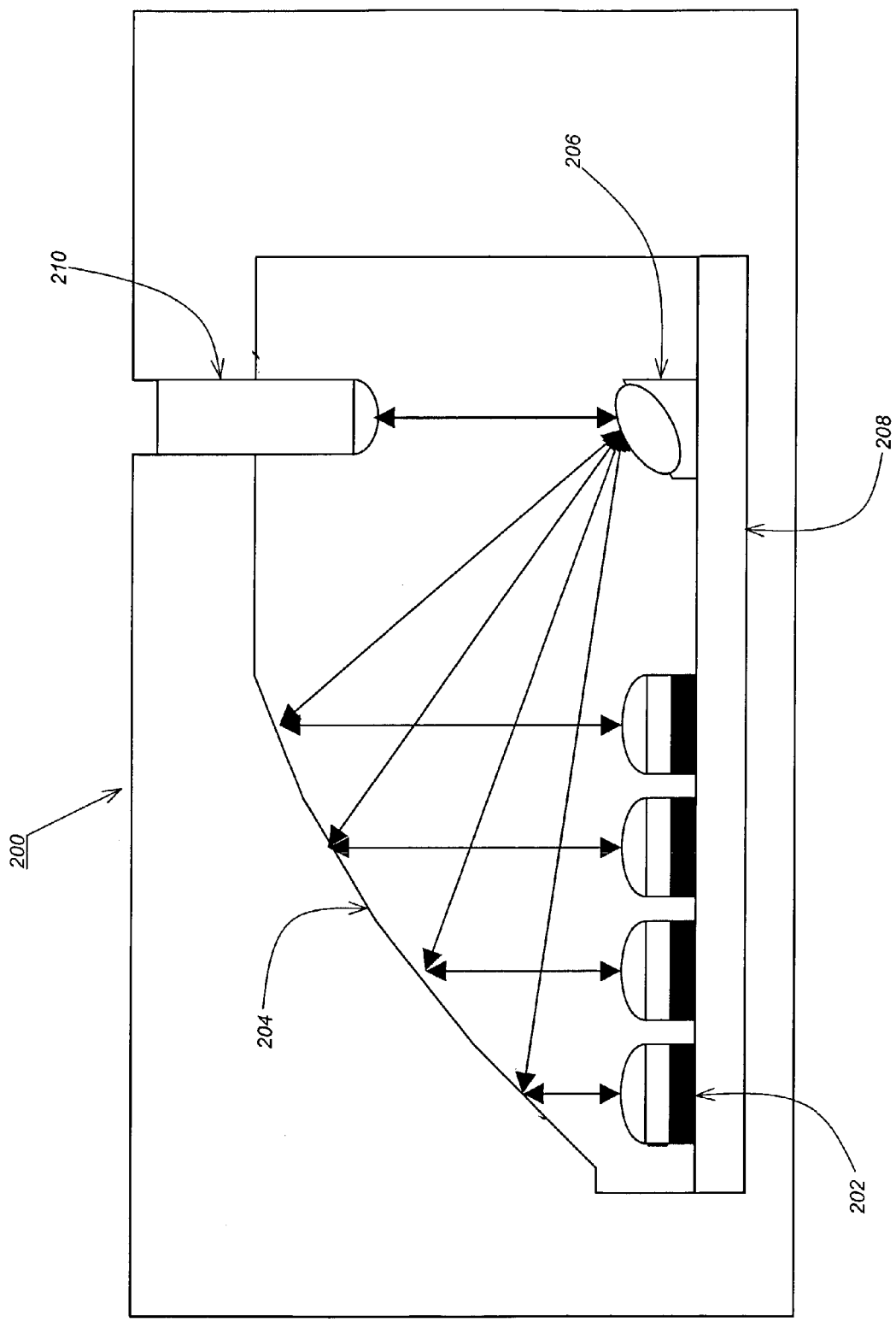
FIG. 2 shows a cross section of a wavelength selectable light source according to another embodiment of the present invention.

FIG. 2 shows a cross-section of a wavelength selectable light source 200 according to an alternative embodiment of the present invention. This wavelength selectable light source 200 includes a one-dimensional (1-D) array of VCSELs 202 with integrated collimation lenses, which greatly simplifies the coupling scheme because it allows for a simpler, first fixed-position mirror 204, such as a 1-D array of flat surfaced mirrors, as well as the use of a simpler second movable mirror 206, such as a 1-axis movable MEMs mirror rather than a 2-axis movable MEMs mirror. Moreover, each of the VCSELs in the 1-D array of VCSELs 202 comprises a separate VCSEL die that is individually placed in a single row along with the second movable mirror 206 on a copper heat spreader 208. The 1-D array of flat surfaced mirrors comprising the first fixed-position mirror 204 is positioned directly above the 1-D array of VCSELs 202. The first fixed-position mirror 204 and a fiber with lens 210 could be integrated using deep silicon etching. This assembly would serve as the structural support for all the pieces, as well as providing the mirror facets of the first fixed-position mirror 204, wherein these mirror facets could be coated with metal to achieve higher reflectivity. If optical pumping were used, only the second movable mirror 206 would need to be electrically contacted. The entire assembly would then be mounted on a temperature controller. Moreover, the assembly size would be approximately 4 mm wide by 3 mm tall, by 1 mm deep.

Figure 3:
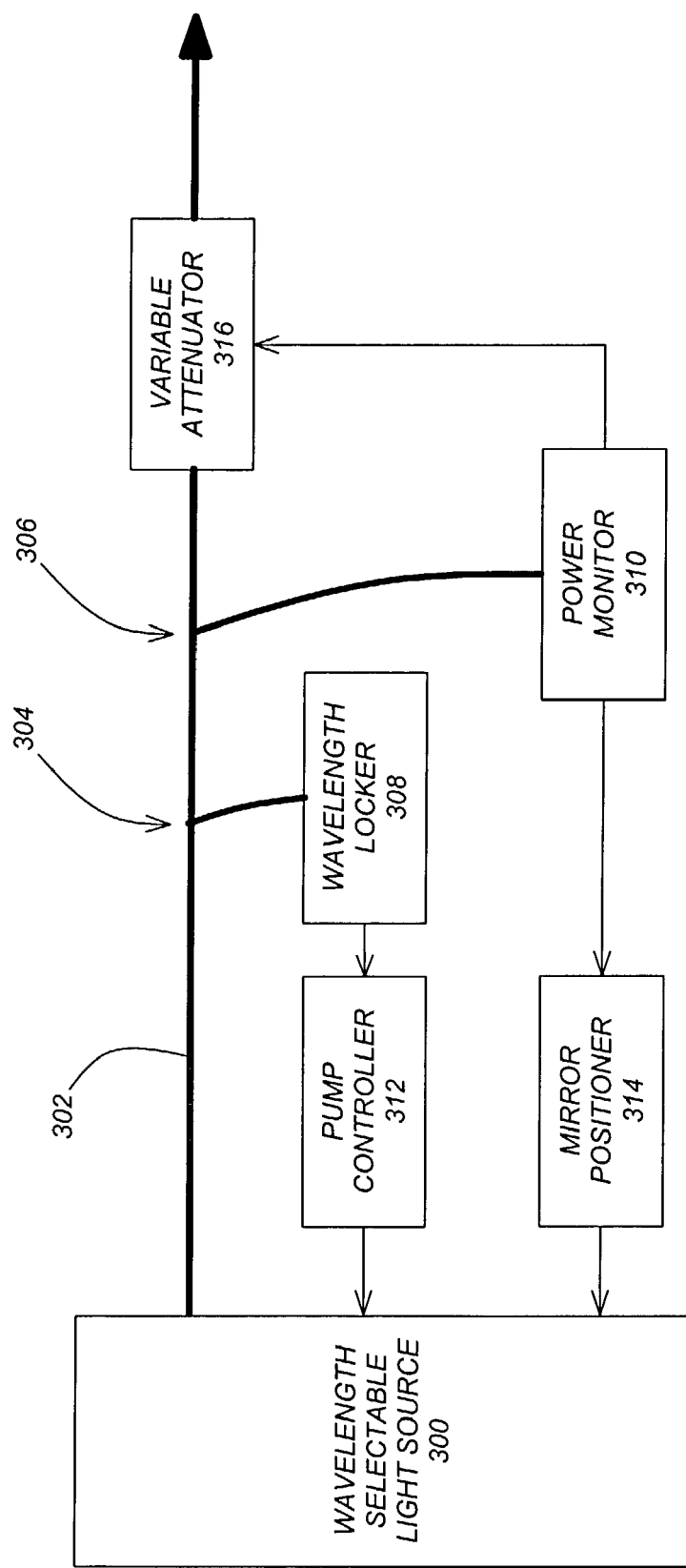
FIG. 3 shows a possible control scheme for the wavelength selectable light source, such as those shown in FIGS. 1A, 1B and 2.

FIG. 3 shows a possible control scheme for a wavelength selectable light source 300, such as the wavelength selectable light source 100 shown in FIGS. 1A and 1B and the wavelength selectable light source 200 shown in FIG. 2. The output 302 from the wavelength selectable light source 300 is tapped off in two places 304 and 306, wherein tap 304 is input to a wavelength locker 308 and tap 306 is input to a power monitor 310. The wavelength locker 308 controls a pump controller 312 and the power monitor 310 controls a mirror positioner 314 and variable attenuator 316.

The wavelength locker 308 makes changes to pump power in the wavelength selectable light source 300 to fine-tune the emission wavelength of the VCSELs through heating effects.

The power monitor 310 makes minor fine adjustments to the second movable mirror's position in the wavelength selectable light source 300 by controlling the mirror positioner 314. This maybe necessary to accommodate aging of the second movable mirror. Fine position control may be required to maximize the coupling of the VCSELs' output to the output optical fiber of the wavelength selectable light source 300.

It may also be necessary to maximize the coupling of the optical pump beam into a selected VCSEL. This is particularly true when features are present on the VCSEL for modal and polarization control, which require precision optical pump beam alignment for efficient and stable VCSEL operation.

Since the output power of the VCSEL can change as the pump power is increased, the power monitor 310 also makes changes to the amount of attenuation provided by the variable attenuator 312 in order to maintain constant power at the final laser output.

CONCLUSION

This concludes the description of the preferred embodiment of the present invention. The following describes some alternative embodiments for practicing the present invention.

Alternate embodiments include the use of a smooth parabolic mirror, the use of electrically pumped VCSEL elements, the use of a separate component micro-lens array, and the use of thermo-electric cooling or heating or current injection for fine wavelength tuning (as opposed to pump power).

It is not necessary for the 2-D array of VCSELs to be fabricated on a single chip. Combinations of single-wavelength/element chips and multiple-wavelength/element chips can be used to achieve the wavelength range desired from the wavelength selectable light source.

The elements of the 2-D array of VCSELs need not even be single wavelength devices, but may themselves be tunable-lasers designed to emit in different wavelength ranges.

Moreover, the present invention does not limit the 2-D array of VCSELs to any single material system or type of laser. The 2-D array of VCSELs need not be comprised of VCSELs, but could be comprised of any set of light emitting devices designed to produce light emission substantially normal to the surface of the array. For example, rather than using a 2-D array of VCSELs, the present invention could also be practiced, wholly or in part, using in-plane fixed-wavelength or tunable-lasers. In addition, a 2-D array of light emitting diodes or other light sources could be used in place of the 2-D array of VCSELs. Many alternatives are available for the 2-D array of VCSELs.

Further, as shown in FIG. 2, the light emitters need not be arranged in a 2-D array. The present invention also includes the use of a one-dimensional array of light emitters.

The output of the wavelength selectable light source need not be directed to a lens and output optical fiber. The output could be delivered to any number of different output components, depending on the required application, such as an optical window, a photodetector, or other combination of other required optical elements, in addition to the lens and output optical fiber.

Rather than using the second moveable mirror, the lens and output optical fiber could be located at the common area. The different output components described above could also be located at the common area.

The 2-D array of micro-lens may not be a separate component, if such functionality is incorporated into the 2-D array of light emitters, in a manner to that described in FIG. 2.

In summary, the present invention describes a wavelength selectable light source comprised of a two-dimensional (2-D) array of variable wavelength vertical-cavity surface-emitting lasers (VCSELs), wherein light beams emitted from the VCSELs are coupled into an output optical fiber. The light beams emitted from the VCSELs are collimated via a 2-D array of micro-lenses, the collimated light beams impinge upon a first fixed-position mirror that points each of the collimated light beams toward a second movable mirror located at a common focal point in a common area, and the second movable mirror redirects the collimated light beams into a lens coupled to the output optical fiber. By moving the second movable mirror, different ones of the collimated light beams can be directed into the output optical fiber, so that the second movable mirror performs a wavelength selection function.

The foregoing description of one or more embodiments of the invention has been presented for the purposes of illustration and description. It is not intended to be exhaustive or to limit the invention to the precise form disclosed. Many modifications and variations are possible in Light of the above teaching. It is intended that the scope of the invention be limited not by this detailed description, but rather by the claims appended hereto.

What is claimed is:

1. A wavelength selectable light source comprised of an array of variable wavelength light emitters, wherein one of a plurality of light beams emitted from the array is selected and directed in an optical output system using a mirror system with no substantial relative motion between the array and the optical output system, and wherein the mirror system comprises a first-fixed position mirror having an array of mirrors held in fixed position that reflect the light beams to a second moveable mirror that selects and redirects one of the reflected light beams to perform wavelength selection.

2. The wavelength selectable light source of claim 1, wherein the array of variable wavelength light emitters comprises a two-dimensional (2-D) array.

3. The wavelength selectable light source of claim 1, wherein the array of variable wavelength light emitters comprises a one-dimensional (1-D) array.

4. The wavelength selectable light source of claim 1, wherein the light emitters comprise vertical-cavity surface-emitting lasers (VCSELs).

5. The wavelength selectable light source of claim 1, wherein the light emitters comprise light emitting diodes.

6. The wavelength selectable light source of claim 1, wherein the first fixed-position mirror redirects the light beams toward a common area where the second moveable mirror is located.

7. The wavelength selectable light source of claim 1, wherein different ones of the light beams are redirected to the optical output system by moving the second movable mirror, so that the second movable mirror performs wavelength selection.

8. The wavelength selectable light source of claim 1, wherein the fixed position mirror is an array of substantially flat mirrors.

9. The wavelength selectable light source of claim 8, wherein the array of substantially flat mirrors corresponds one-to-one with the light emitters.

10. The wavelength selectable light source of claim 9, wherein each element of the array of substantially flat mirrors is substantially centered along a surface-normal central axis of each light emitter.

11. The wavelength selectable light source of claim 8, wherein the array of substantially flat mirrors corresponds one-to-many with the light emitters.

12. The wavelength selectable light source claim 11, wherein each element of the army of substantially flat mirrors is substantially centered along a surface-normal central axis of a cluster of light emitters.

13. The wavelength selectable light source claim 8, wherein the array of substantially flat mirrors deflects the beams to a common area without substantially affecting the shape of the beams.

14. A wavelength selectable light source comprised of an array of variable wavelength light emitters, wherein one of a plurality of light beams emitted from the array is selected and directed to an optical output system using a mirror system with no substantial relative motion between the array and the optical output system, the mirror system comprises a first fixed-position mirror and a second moveable mirror, and the first fixed position mirror is substantially parabolic in shape with the light beams aligned substantially parallel to an axis of the fixed position mirror.

15. The wavelength selectable light source of claim 1, wherein the second movable mirror comprises one or more micro-electro-mechanical (MEMs) mirrors.

16. The wavelength selectable light source of claim 1, wherein the mirror system comprises a first fixed-position mirror and the first fixed-position mirror redirects the light beams toward a common area where the output optical system is located.

17. The wavelength selectable light source of claim 1, wherein each of the light beams emitted from the array are shaped via a corresponding micro-lens.

18. The wavelength selectable light source of claim 1, wherein the optical output system comprises an optical output fiber.

19. The wavelength selectable light source of claim 18, wherein a lens is coupled to optical output fiber.

20. The wavelength selectable light source of claim 1, further comprising an optical pump for generating an optical pump beam that is delivered to one or more of the light emitters corresponding to a desired wavelength by following a reciprocal optical path.

21. The wavelength selectable light source of claim 20, wherein the optical pump beam is directed by the mirror system towards the light emitters.

22. The wavelength selectable light source of claim 20, wherein the optical pump beam is focused by a micro-lens into an active region of the light emitters.

23. A method of operating a wavelength selectable light source, comprising:
   emitting a plurality of light beams from an array of variable wavelength light emitters;
   selecting one of the light beams emitted from the array; and
   directing the selected light beam to an optical output system using a mirror system with no substantial relative motion between the array and the optical output system,
   wherein the mirror system comprises an array of mirrors held in a fixed position that reflect the light beams to a moveable mirror that selects and redirects one of the reflected light beams to perform wavelength selection.

24. The method of claim 23, wherein the array of variable wavelength light emitters comprises a two-dimensional (2-D)-array.

25. The method of claim 23, wherein the array of variable wavelength light emitters comprises a one-dimensional (1-D) array.

26. The method of claim 23, wherein the light emitters comprise vertical-cavity surface-emitting lasers (VCSELs).

27. The method of claim 23, wherein the light emitters comprise light emitting diodes.

28. The method of claim 23, wherein the first fixed-position mirror redirects the light beams toward a common area where the second moveable mirror is located.

29. The method of claim 23, wherein different ones of the light beams are redirected to the optical output system by moving the second movable mirror, so that the second movable mirror performs wavelength selection.

30. The method of claim 23, wherein the fixed position mirror is an array of substantially flat mirrors.

31. The method of claim 30, wherein the array of substantially flat mirrors corresponds one-to-one with the light emitters.

32. The method of claim 31, wherein each element of the array of substantially flat mirrors is substantially centered along a surface-normal central axis of each light emitter.

33. The method of claim 30, wherein the array of substantially flat mirrors corresponds one-to-many with the light emitters.

34. The method of claim 33, wherein each element of the array of substantially flat mirrors is substantially centered along a surface-normal central axis of a cluster of light emitters.

35. The method of claim 30, wherein the array of substantially flat mirrors deflects the beams to a common area without substantially affecting the shape of the beams.

36. A method of operating a wavelength selectable light source, comprising:
   emitting a plurality of light beams from an array of variable wavelength light emitters;
   selecting one of the light beams emitted from the array; and
   directing the selected light beam to an optical output system using a mirror system with no substantial relative motion between the array and the optical output system,
   wherein the mirror system comprises a first fixed-position mirror and a second moveable mirror, and the first fixed position mirror is substantially parabolic in shape with the light beams aligned substantially parallel to an axis of the fixed position mirror.

37. The method of claim 23, wherein the second movable mirror comprises one or more micro-electro-mechanical (MEMs) mirrors.

38. The method of claim 23, wherein the mirror system comprises a first fixed-position mirror and the first fixed-position mirror redirects the light beams toward a common area where the output optical system resides.

39. The method of claim 23, wherein each of the light beams emitted from the array are shaped via a corresponding micro-lens.

40. The method of claim 23, wherein the optical output system comprises an optical output fiber.

41. The method of claim 40, wherein a lens is coupled to optical output fiber.

42. The method of claim 23, further comprising generating an optical pump beam at an optical pump, wherein the optical pump beam is delivered to one or more of the light emitters corresponding to a desired wavelength by following a reciprocal optical path.

43. The method of claim 42, wherein the optical pump beam is directed by the mirror system cowards the light emitters.

44. The method of claim 42, wherein the optical pump beam is focused by a micro-lens into an active region of the light emitter.

* * * * *

UNITED STATES PATENT AND TRADEMARK OFFICE
CERTIFICATE OF CORRECTION

PATENT NO. : 6,980,572 B2
APPLICATION NO. : 10/446980
DATED : December 27, 2005
INVENTOR(S) : Jonathan C. Geske It is certified that error appears in the above-identified patent and that said Letters Patent is hereby corrected as shown below:

Column 7, line 54, for claim 1, "in fixed" should read --in a fixed--.

Column 8, line 24, for claim 12, "army" should read --array--.

Column 10, line 40, for claim 43, "cowards" should read --towards--.

Signed and Sealed this

Twelfth Day of September, 2006

JON W. DUDAS
*Director of the United States Patent and Trademark Office*